(12) United States Patent
Atkinson

(10) Patent No.: US 6,731,923 B2
(45) Date of Patent: May 4, 2004

(54) DIRECT CONVERSION CIRCUIT FOR RADIO FREQUENCY SIGNALS

(75) Inventor: Simon Atkinson, Heathfield (GB)

(73) Assignee: Analog Devices, Inc., Norwood, MA (US)

( * ) Notice: Subject to any disclaimer, the term of this patent is extended or adjusted under 35 U.S.C. 154(b) by 470 days.

(21) Appl. No.: 09/785,383

(22) Filed: Feb. 16, 2001

(65) Prior Publication Data

US 2001/0039182 A1 Nov. 8, 2001

Related U.S. Application Data

(63) Continuation-in-part of application No. 09/133,781, filed on Aug. 12, 1998, now Pat. No. 6,243,569.

(51) Int. Cl.$^7$ ................................................. H04B 1/28
(52) U.S. Cl. ........................ 455/323; 455/313; 455/20
(58) Field of Search ................................. 455/324, 323, 455/313, 318, 260, 265, 264, 20; 375/322, 327

(56) References Cited

U.S. PATENT DOCUMENTS

| | | |
|---|---|---|
| 4,811,425 A | 3/1989 | Feerst |
| 5,003,621 A | 3/1991 | Gailus |
| 5,303,417 A | 4/1994 | Laws |
| 5,339,040 A | 8/1994 | Loper |
| 5,428,837 A | 6/1995 | Bayruns et al. |
| 5,438,692 A | 8/1995 | Mohindra |
| 5,530,929 A | 6/1996 | Lindqvist et al. |
| 5,584,059 A | 12/1996 | Turney et al. |
| 5,584,068 A | 12/1996 | Mohindra |
| 5,606,731 A | 2/1997 | Pace et al. |
| 5,793,794 A * | 8/1998 | Kato et al. ................... 375/149 |
| 5,822,688 A | 10/1998 | Eul |
| 5,903,196 A | 5/1999 | Salvi et al. |
| 5,949,830 A | 9/1999 | Nakanishi |
| 5,973,570 A | 10/1999 | Salvi et al. |
| 5,983,081 A | 11/1999 | Lehtinen |
| 5,983,088 A | 11/1999 | Aschwanden |
| 6,006,081 A * | 12/1999 | Moore ........................ 455/326 |
| 6,052,571 A | 4/2000 | Mishima et al. |
| 6,243,569 B1 * | 6/2001 | Atkinson .................... 455/324 |
| 6,484,042 B1 * | 11/2002 | Loke ....................... 455/550.1 |
| 2001/0039182 A1 * | 11/2001 | Atkinson ..................... 455/20 |

FOREIGN PATENT DOCUMENTS

| | | |
|---|---|---|
| GB | 2 340 687 | 2/2000 |
| JP | 61-273005 | 12/1986 |
| JP | 7-245568 | 9/1995 |
| JP | 9-172465 | 6/1997 |
| WO | WO 96/38924 | 12/1996 |

OTHER PUBLICATIONS

[http://www.analog.com/publications/whitepapers/products/AD9042.html.], Universal Basestation/Wideband Receivers Background Information [AD9042], 1995.

Brannon, Brad, [http://www.analog.com/publications/magazines/Dialogue/29–2/wdbndradios.html.], Wideband Radios Need Wide Dynamic Range Converters, 1995.

* cited by examiner

Primary Examiner—Nay Maung
Assistant Examiner—Tan Trinh
(74) Attorney, Agent, or Firm—Gauthier & Connors LLP

(57) ABSTRACT

A direct conversion circuit for radio frequency signals is disclosed. The circuit includes a pair of quadrature related mixers, a phase shift unit, and a local oscillator. The pair of quadrature related mixers is coupled to a radio frequency signal input port for mixing down a radio frequency input signal. The phase shift unit is in communication with at least one of the pair of mixers for phase shifting a local oscillator signal. The local oscillator produces the local oscillator signal. The local oscillator includes a non-integer frequency multiplier for multiplying the frequency of a first voltage controlled oscillator signal by a non-integer value to produce the local oscillator signal.

9 Claims, 3 Drawing Sheets

DIRECT CONVERSION CIRCUIT FOR RADIO FREQUENCY SIGNALS

This patent application is a continuation-in-part patent application of U.S. Ser. No. 09/133,781 filed on Aug. 12, 1998 now U.S. Pat. No. 6,243,569.

BACKGROUND OF THE INVENTION

The present invention generally relates to receivers and transmitters for radio frequency (RF) signals, and particularly relates to direct conversion receivers.

Unlike a superheterodyne receiver, which converts an input RF signal to an intermediate frequency, a direct conversion receiver does not convert the input RF signal to an intermediate frequency. A direct conversion receiver mixes directly to a direct current (DC) signal, and is sometimes referred to as a zero IF receiver because the intermediate frequency is zero hertz (DC). The modulation information only is represented in the down conversion, and there is no carrier information that is typically associated with an intermediate frequency. In a direct conversion receiver the local oscillator signal is operating at the same frequency as the input RF signal. U.S. Pat. Nos. 5,438,692 and 5,548,068 disclose conventional direct conversion receivers.

In direct conversion, the modulation information is preserved through quadrature down conversion, which involves mixing the incoming line or carrier with a local oscillator signal along two different paths. The local oscillator signal along one path may be at zero phase (0°) with respect to the input RF signal, and may be phase shifted to 90° along the other path. Alternatively, one path may be at −45° while the other is at +45° with respect to the input signal. See for example, U.S. Pat. No. 5,303,417. In any event, the circuit paths are typically mutually 90° different in phase, and one path is referred to as the I channel while the other is referred to as the Q channel. The quadrature down conversion method preserves the necessary phase information within the input signal.

As shown in FIG. 1, a direct conversion circuit of the prior art includes an input port 10 for receiving an input RF signal from an RF antenna. The input signal is divided between two input paths. The input signal in one input path is mixed at mixer 12 with the local oscillator signal 14 at zero degrees phase shift. The input signal in the other input path is mixed at mixer 16 with the local oscillator signal at 90° phase shift. The 90° phase shift in the local oscillator signal is achieved by phase shift device 20. The local oscillator signal is produced in the illustrated conventional local oscillator circuit by first mixing two signals from voltage controlled oscillators (VCOs) 22 and 24 at mixer 26. The VCOs 22 and 24 may or may not be integrated in the same integrated circuit (IC) as the mixers 12 and 16. The signal is then filtered at bandpass filter 28 to produce the local oscillator signal 14. The bandpass filter 28 is typically not integrated on the same IC as indicated by the dashed line 29. The frequency of the local oscillator signal 14 is the same as the frequency of the input RF signal at input port 10.

Interference may occur if the local oscillator signal radiates to the input RF signal. Because the frequencies of these signals are the same, the local oscillator signal cannot be frequency filtered from the incoming signal. The incoming signal would, in effect, be blocked. U.S. Pat. Nos. 4,811,425 and 5,428,837 are directed to reducing the effects of leakage of local oscillator signals to RF input signals in zero IF receivers.

Moreover, interference may occur if the RF input signal radiates to the VCO. Since VCOs are typically very sensitive, any signal that is close in frequency to the frequency of the VCO may interact with it, even if the signal comprises only a small amount of energy. This is because the VCO will selectively amplify signals at or near its frequency, causing a low energy noise signal at or near its frequency to appear to be a spectrally clean signal.

One way of overcoming this problem is to employ a VCO that operates at a frequency different than the input RF signal. The frequency of the VCO signal is then modified to produce a local oscillator signal at the same frequency as the input RF signal. For example, as shown in FIG. 1, the signal from one VCO 22 (at frequency $F_1$) may be combined with the signal from another VCO 24 (at frequency $F_2$) by mixer 26. The combined signal may then be filtered by a bandpass filter 28 to produce a local oscillator signal 14. The product, however, of the $F_1$ and $F_2$ signals, will include spurious signals that must be filtered out to produce the local oscillator signal. For example, the product of two sine functions $\sin(\alpha) \times \sin(\beta)$ equals $\frac{1}{2}\cos(\alpha-\beta) - \frac{1}{2}\cos(\alpha+\beta)$. Two frequencies would be produced at the mixer ($F_1+F_2$ and $F_1-F_2$), and one would have to be filtered out. It is typically necessary to do this type of filtering off IC, which further invites interference or leakage of the local oscillator signal to the input RF signal.

In other conventional local oscillator circuits, one VCO only might be employed and the output of the VCO would be input to a frequency doubler, then to a bandpass filter, and finally to the phase shift device 20. The frequency of the VCO ($F_1$) could be one half the frequency of the RF input signal, and the frequency of the local oscillator would then be $2F_1$. In further conventional local oscillator circuits, the frequency of the VCO ($F_1$) could be twice the frequency of the RF input signal, and the frequency of the local oscillator signal may be equal to $\frac{1}{2}F_1$. This could also be achieved with one VCO ($F_1$), whose output could be input to a one-half frequency divider to produce the local oscillator signal for input to the phase shift device 20. In each such circuit however, the local oscillator signal may still radiate to the RF input signal, and the VCO may be sensitive to harmonic frequencies of the RF input signal.

Such conventional techniques do not fully alleviate the interference problems. It is an object of the present invention to provide a direct conversion receiver or transmitter that has reduced leakage or interference between the radio frequency input signal and the local oscillator.

SUMMARY OF THE INVENTION

A direct conversion circuit for radio frequency signals is disclosed. The circuit includes a pair of quadrature related mixers, a phase shift unit, and a local oscillator. The pair of quadrature related mixers is coupled to a radio frequency signal input port for mixing down a radio frequency input signal. The phase shift unit is in communication with at least one of the pair of mixers for phase shifting a local oscillator signal. The local oscillator produces the local oscillator signal. The local oscillator includes a non-integer frequency multiplier for multiplying the frequency of a first voltage controlled oscillator signal by a non-integer value to produce the local oscillator signal.

BRIEF DESCRIPTION OF THE DRAWINGS

The following detailed description of the illustrated embodiments may be further understood with reference to the accompanying drawings in which.

DETAILED DESCRIPTION OF THE ILLUSTRATED EMBODIMENTS

Figure 1:
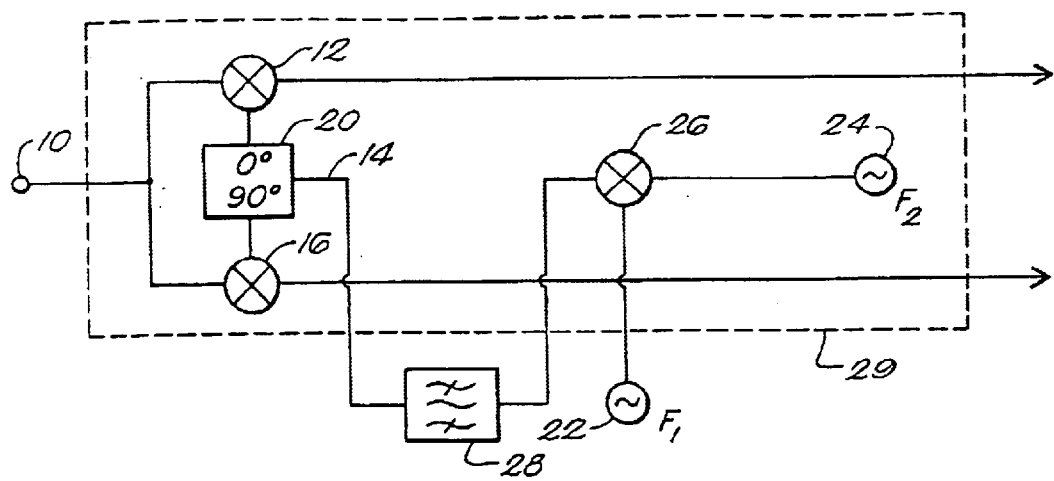
FIG. 1 shows a schematic representation of a prior art direct conversion circuit.
Figure 2:
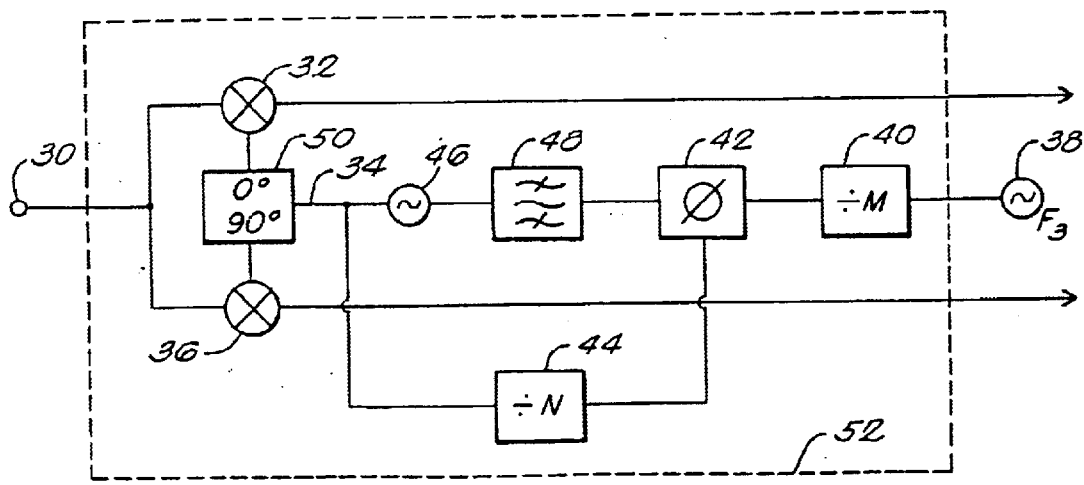
FIG. 2 shows a schematic representation of a direct conversion circuit of the invention.

As shown in FIG. 2, a direct conversion circuit of the invention includes an input port 30 for receiving an input RF signal from a radio frequency signal antenna. The input signal is divided between two channels, one of which is mixed at mixer 32 with a local oscillator signal 34 at zero degrees phase shift, and the other of which is mixed at mixer 36 with the local oscillator signal at 90°.

The local oscillator signal 34 is generated by a phase locked loop as follows. In the reference path, a first signal having a frequency $F_3$ is generated by first voltage controlled oscillator 38. The first signal is input to a frequency divider 40 (÷M), the output of which is input to a first input of a phase-sensitive detector 42 of a phase locked loop. The output of the detector 42 is fed through a low pass filter 48, and the output of the low pass filter 48 is input to a second voltage controlled oscillator 46, the output of which is fed to both the phase shift device 50 and to another frequency divider 44 (÷N). The output of the frequency divider 44 is input to the detector 42. The output of the second voltage controlled oscillator 46 provides the local oscillator signal 34.

If, for example, the frequency of the input signal at port 30 is 1.8 GHz, then the VCO 38 frequency could be selected to be 1.35 GHz, where the value M of the divider 40 is selected to be 3 and the value N of the divider 44 is selected to be 4. The frequency of the second oscillator 46 would be selected to be 1.8 GHz in this example. Since the divider 40 is in the reference path, it multiplies the frequency of $F_3$ by 1/M. Since the divider 44 is in the feedback path, it multiplies the frequency of the phase locked loop signal by N. The frequency, therefore, of the local oscillator signal 34 will be $(N/M) \times F_3 = 4/3 \times 1.35$ GHz=1.8 GHz, which is the same as the frequency of the input RF signal.

The frequency $F_3$ of the signal from the voltage controlled oscillator 38 in this example is not harmonically related, therefore, to the frequency of the input RF signal. This is because the frequency of the input RF signal is equal to 4/3 $F_3$. Any coupling of the input RF signal to the VCO 36, therefore, should have a minimal effect on the operation of the VCO 36.

The second oscillator is also protected from interference since it forms part of the phase locked loop. The phase locked loop causes the VCO 46 to track the reference frequency from the VCO 38. If the VCO 38 is spectrally clean, then it is not required that the second VCO 46 be spectrally clean. This permits the second oscillator 46 to be fully integrated on the same integrated circuit as the mixers 32 and 36. Typically, VCOs that are integrated on a single IC tend to be noisy. Because the feedback loop will strip any noise off of the VCO 46, superior isolation may then be achieved than would be possible by having the VCO 46 not integrated. The VCO 38 need not be integrated on the same IC as the mixers 32 and 36.

Additionally, the phase locked loop in a circuit of the invention has a wide operating bandwidth. If the frequency $F_3$ of the VCO 38 rapidly changes during operation, the phase locked loop will track it. The entire loop is, in effect, a voltage controlled oscillator in which the sensitivity to interaction from the RF signal is removed. Specifically, if interference from the input RF signal reaches the VCO 46, it will try to transfer modulation to it. The phase locked loop will compare this signal to the reference signal, and apply inverse compensation to ensure that it remains clean. So, even if spurious energy signals interact with the VCO 46, the phase locked loop will strip them off.

The voltage controlled oscillator is offset, but the local oscillator signal is generated by a non-integer multiplication or division using a phase locked loop. By employing a wideband phase locked loop as discussed above, the phase of the loop will track that of the incoming voltage controlled oscillator over a wide bandwidth. As such, if the phase locked loop bandwidth is more wide than the RF filter in the return path then the free running phase noise requirements of the voltage controlled oscillator within the loop become sufficiently trivial that the oscillator may be completely integrated on one integrated circuit chip. By keeping the phase locked loop circuitry entirely on-chip, the coupling of the local oscillator signal to the input RF signal is greatly reduced (due to elimination of cross-package radiation). The resultant DC offset at the mixer output is also reduced.

Other benefits of circuits of the invention are that the comparison frequency in the phase locked loop phase detector occurs at a very high frequency, e.g., greater than the loop bandwidth. The integration properties of the voltage controlled oscillator and the loop filter, therefore, ensure that the resultant local oscillator signal contains low levels only (if any) of spurious sidebands. Additionally, through careful selection of the reference and loop divide ratios, it is possible to use a single reference oscillator to cover multi-band applications. This is because switching the dividers allows the phase locked loop to switch from being a non-integer divider to a non-integer multiplier.

Figure 3:
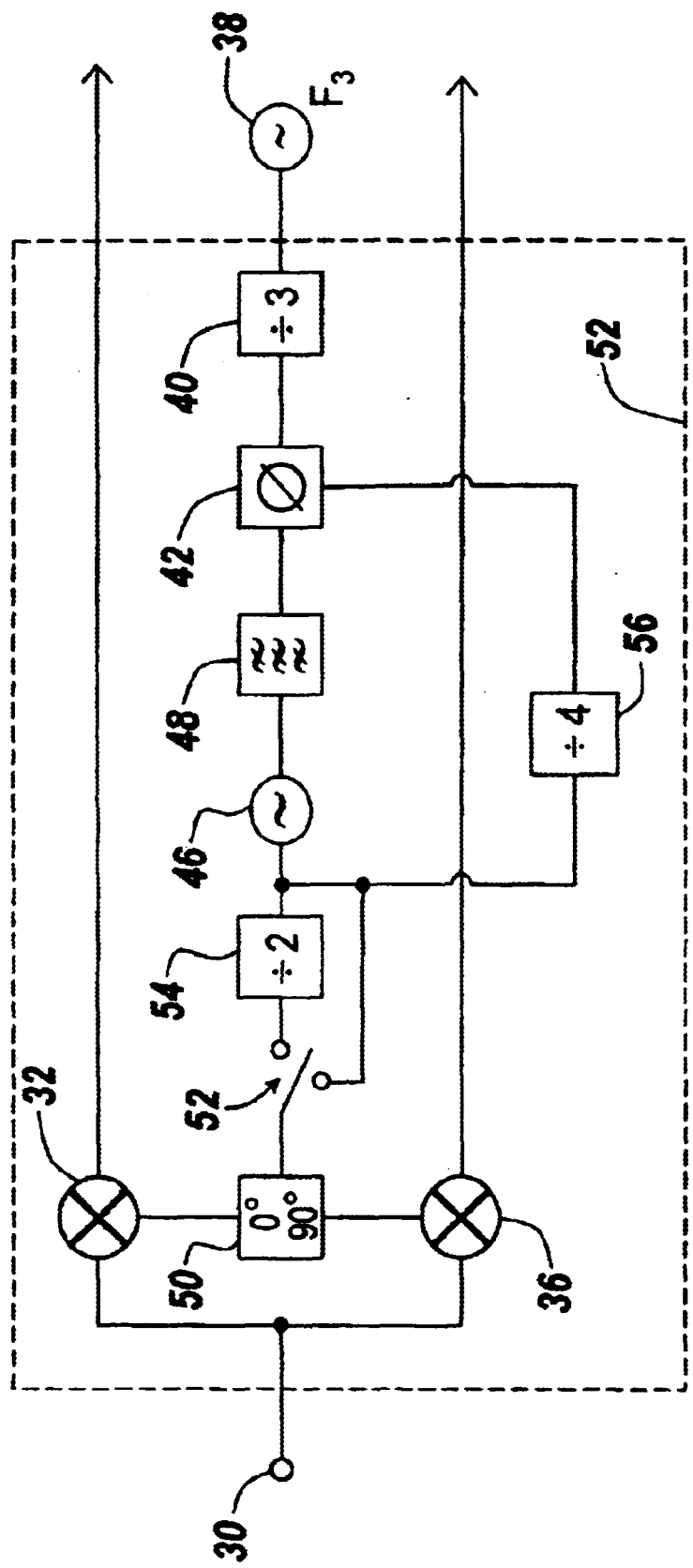
FIG. 3 shows a schematic representation of a direct conversion circuit in accordance with another embodiment of the invention.

In further embodiments, a circuit of the invention may include a switch 52 for switching between the use of a divide by two divider 54, and bypassing the divider 54 in providing the reference signal to the phase shift device 50 as shown in FIG. 3. If the received signal is a global system for mobile communication that operates at 1800 MHz. (GSM 1800), then the switch 52 would bypass the divider 54. The reference signal would then by-pass the divider 54, causing the loop signal (which is 4/3×1350 MHz.) to be provided to the phase shift device 50 as the local oscillator signal of 1800 MHz. If the received signal operates at 900 MHz. (GSM900), then the switch 52 would cause the reference signal to pass through the divider 54. In this case, the reference path would cause the loop signal frequency to be divided by two (2/3×1350 MHz.), resulting in a local oscillator signal of 900 MHz.

Figure 4:
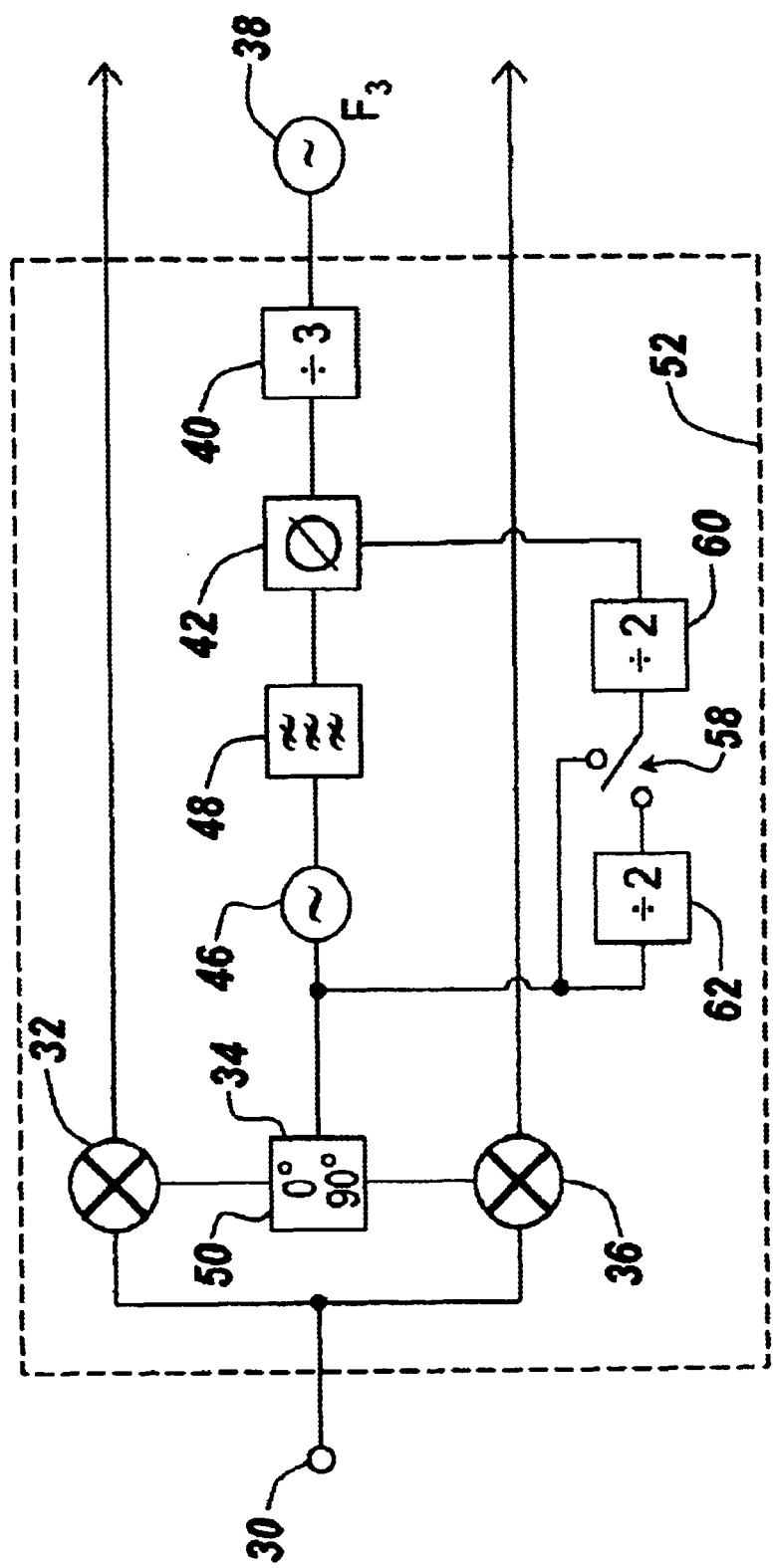
FIG. 4 shows a schematic representation of a direct conversion circuit in accordance with a further embodiment of the invention.

As shown in FIG. 4, in another circuit of an embodiment of the invention, the feedback path may include a switch 58 and two separate divide by two dividers 60 and 62 as shown in FIG. 4. Again, if the received signal is a GSM900 signal, then the switch 58 would bypass the second divider 62. The loop would then multiply the frequency of the VCO signal (1350 MHz.) by 2/3, resulting in a local oscillator signal of 900 MHz. If the received signal is a GSM1800 signal, then the switch 58 would cause the feedback signal to pass through the second divider 62 as well as the first divider 60. In this case, the loop would multiply the frequency of the VCO signal (1350 MHz.) by 4/3 resulting in a local oscillator signal of 1800 MHz.

The above description relates to employing circuits of the invention to provide direct conversion receivers for radio frequency signals. Circuits of the invention may also be employed to provide direct conversion transmitters as well by directing the I and Q channel signals into the mixers, the outputs of which are combined and delivered to a transmitting antenna.

Those skilled in the art will appreciate that modifications and variations may be made to the above disclosed embodiments without departing from the spirit and scope of the invention.

What is claimed is:

1. A direct conversion circuit for radio frequency signals, said circuit comprising:

a pair of quadrature related mixers coupled to a radio frequency signal input port for mixing down radio frequency input signals having a frequency of $f_1$ in a first mode of operation, and alternatively for mixing down radio frequency input signals of a second frequency $f_2$ in a second mode of operation where $f_1=2f_2$; and a local oscillator for producing a local oscillator signal, said local oscillator including a phase locked loop frequency multiplier for multiplying the frequency of a first voltage controlled oscillator signal by ⅓ while said circuit is operating in said first mode of operation, said phase locked loop frequency multiplier including a frequency divider for dividing the signal by an integer that is a factor of 2 in the feedback path of the phase locked loop.

2. A direct conversion circuit as claimed in claim 1, wherein said first voltage controlled oscillator produces a signal having a frequency of about 1350 MHz.

3. A direct conversion circuit for radio frequency signals, said circuit comprising:

a pair of quadrature related mixers coupled to a radio frequency signal input port for mixing down radio frequency input signals of about 1800 MHz in a first mode of operation, and for mixing down radio frequency input signals of about 900 MHz in a second mode of operation; and a local oscillator for producing a local oscillator signal at a frequency of $f_{LO}$, said local oscillator including a non-integer frequency multiplier means for multiplying the frequency of a first voltage controlled oscillator signal by a non-integer number greater than one while said circuit is operating in said first mode of operation, and for dividing the frequency of the first voltage oscillator by a non-integer number greater than one while said circuit is operating in said second mode of operation.

4. A direct conversion circuit as claimed in claim 3, wherein said voltage controlled oscillator produces a signal having a frequency of 1350 MHz.

5. A direct conversion circuit for radio frequency signals, said circuit comprising:

a pair of quadrature related mixers coupled to a radio frequency signal input port for mixing down radio frequency input signals of about 1800 MHz in a first mode of operation, and for mixing down radio frequency input signals of about 900 MHz in a second mode of operation;

a phase shift device coupled to said pair of quadrature related mixers;

a local oscillator for producing a local oscillator signal at a frequency of $f_{LO}$, said local oscillator including a non-integer frequency multiplier means for multiplying the frequency of a first voltage controlled oscillator signal by a non-integer number; and a local oscillator path through which a local oscillator signal may pass from said local oscillator to said phase shift device, said local oscillator path including a local oscillator path switch and a frequency divider, the local oscillator path switch being movable between first and second positions such that said local oscillator signal may pass through said frequency divider when said switch is in said first position, and said local oscillator signal may by-pass said frequency divider when said switch is in said second position.

6. A direct conversion circuit as claimed in claim 5, wherein said frequency divider is a divide by two frequency divider.

7. A direct conversion circuit for radio frequency signals, said circuit comprising:

a pair of quadrature related mixers coupled to a radio frequency signal input port for mixing down radio frequency input signals of about 1800 MHz in a first mode of operation, and for mixing down radio frequency input signals of about 900 MHz in a second mode of operation; and a local oscillator for producing a local oscillator signal at a frequency of $f_{LO}$, said local oscillator including a non-integer frequency multiplier means for multiplying the frequency of a first voltage controlled oscillator signal by a non-integer number, said non-integer frequency multiplier means including a feedback loop through which a feedback signal may pass, said feedback loop including first and second frequency dividers, and a switch that is movable between first and second positions, said feedback signal passing through both frequency dividers when said switch is in said first position, and said feedback signal passing through one of the first or second dividers when said switch is in said second position.

8. A direct conversion circuit as claimed in claim 7, wherein each of said first and second frequency dividers is a divide by two frequency divider.

9. A direct conversion circuit as claimed in claim 7, wherein said voltage controlled oscillator signal has a frequency of 1350 MHz., and said local oscillator provides non-integer frequency multiplication of ⅓ while said circuit is operating in said first mode of operation, and provides non-integer frequency multiplication of ⅔ while said circuit is operating in said second mode of operation.

* * * * *